United States Patent [19]

Motherbaugh et al.

[11] Patent Number: 5,157,338
[45] Date of Patent: Oct. 20, 1992

[54] ANTENNA VSWR INDICATOR

[75] Inventors: James M. Motherbaugh, 2024 Wiltshire Rd., Akron, Ohio 44313; John E. Keim, Lodi, Ohio

[73] Assignee: James M. Mothersbaugh, Akron, Ohio

[21] Appl. No.: 643,785

[22] Filed: Jan. 22, 1991

[51] Int. Cl.$^5$ .................................... G01R 27/06
[52] U.S. Cl. .................. 324/637; 324/648; 324/646
[58] Field of Search ............ 324/637, 638, 625, 646, 324/648, 614; 455/226, 234

[56] References Cited

U.S. PATENT DOCUMENTS

| 3,031,615 | 5/1962 | Chase et al. | 324/646 |
| 3,115,606 | 12/1964 | Mattingly | 455/234 |
| 3,715,667 | 1/1973 | Nicolson | 324/637 |
| 3,800,218 | 3/1974 | Shekel | 324/646 |
| 4,013,949 | 3/1977 | Ice | 324/648 |
| 4,904,927 | 2/1990 | Garbe et al. | 324/637 |
| 4,962,359 | 10/1990 | Dunsmore | 324/637 |

*Primary Examiner*—Edward L. Coles, Sr.
*Assistant Examiner*—Raphael Bacares
*Attorney, Agent, or Firm*—Oldham, Oldham, & Wilson

[57] ABSTRACT

The invention described a pocket size antenna VSWR indicator having a self-contained low level wideband RF signal source which is applied to an antenna under test through a four arm RF resistive bridge circuit. The bridge circuit has been designed to be very accurate and reliable and provides a novelly positioned reference against which the reflection co-efficient of the transmission system is compared to reliably indicate the VSWR of the system. The bridge circuit provides a flat response over the desired wideband frequency range and over the range of antenna impedances which may be encountered. The RF null or bridge balance is detected in a radio receiver or transceiver tuned to the desired operating frequency, from which an indication of antenna VSWR may be provided. The antenna VSWR may be indicated in a variety of way, such as by means of a numbered or colored dial, a plurality of LEDs or an audio tone shift against an internal reference. Alternatively, the indicator may be calibrated to read VSWR directly by number or by means of a color-dial indicating good, poor or non-usable VSWRs. The VSWR indicator provides the user with an immediate indication of whether the radio transmitter and antenna of the RF transmission system will be properly matched or coupled at the frequency in use, to assure maximum power transfer and efficiency. Additionally, the VSWR indication will immediately provide an indication of the overall system performance and will avoid the possibility of damaging or destroying the RF transmitter. The antenna impedance bridge of the invention allows the antenna to be tuned while keeping the radio carrier wave off the air so as to avoid interference therefrom or the unwanted detection of transmissions. The VSWR indicator of the invention provides a portable, self-contained VSWR indicating device which is extremely simple to operate and which provides an immediate and direct read out or VSWR accurately.

17 Claims, 5 Drawing Sheets

ANTENNA VSWR INDICATOR

BACKGROUND OF THE INVENTION

The present invention generally relates to an indicating instrument used in connection with an RF transmission system to indicate the VSWR of the system. More particularly, the invention relates to an antenna VSWR indicator which allows the VSWR of an antenna in an RF transmission system to be accurately indicated such that the antenna can be properly matched or coupled to an RF transmitter at the frequency in use.

In an RF transmission system, which may include a radio transmitter and antenna system, the power of an RF signal applied to the transmission line from the RF transmitter to the antenna may not be completely absorbed by the antenna or other transmitting apparatus. If the antenna impedance is not properly matched or coupled to the transmitter impedance at the frequency in use, a portion of the RF energy transmitted through the RF transmission line may be reflected back along the transmission line so as to reduce the power transfer or create disturbances in the transmission system. The terminating RF load, such as an antenna, must be properly matched to the RF source, such as an RF transmitter, to assure maximum power transfer and maximum efficiency in the RF transmission circuit.

Upon the occurrence of an improper match of the antenna impedance to the characteristic impedance of the transmitter the reflected energy will generate standing waves on the transmission line. The match between an RF transmitter and antenna may be determined by measuring the power flowing into the antenna as well as the reflected power, if any, flowing back from the antenna along the transmission line therebetween. The ratio of the power flowing into the antenna and the reflected power is called standing wave ratio (SWR) or voltage standing wave ratio (VSWR). For example, an antenna resonant at a given operating frequency will exhibit an impedance of near 50 ohms corresponding to a transmitter impedance of 50 ohms, thereby allowing no reflected power, and giving a VSWR of 1:1. An improperly tuned antenna will cause values of reflected power to show VSWR's of 2:1; 3:1; 4:1; open or short conditions which will degrade overall system performance and reduce the signal strength of the radiated signal. Additionally, any reflected power returned to the RF source along the transmission line could damage or destroy a source such as an RF transmitter.

The phenomena of voltage standing wave ratio (VSWR) is usually defined in terms of the ratio of reflected power and the transmitted power which defines a voltage reflection co-efficient (P). The quality of an impedance match between the RF transmitter and antenna may be defined according to the formula:

$$VSWR = \frac{1 + |P|}{1 - |P|}$$

or $$VSWR = \frac{1 + \sqrt{\frac{\text{reflected power}}{\text{forward power}}}}{1 - \sqrt{\frac{\text{reflected power}}{\text{forward power}}}}$$

Various prior art measurement instruments have been developed for measuring VSWR or giving an indication of the VSWR for a particular Rf transmission system. For example, directional watt meters may be used to measure the forward traveling signal indicating the transmitted power across the transmission line. Similarly, the instrument may be used to measure the reflected signal indicating the reflected power, wherein the relationship between the transmitted and reflected power could then be analyzed to obtain the power ratio necessary to compute the VSWR of the system. A combination of two directional measurement devices could be used to measure the net power delivered by the resultant signal to an ordinary load, thereby giving an indication of the VSWR of the system. As an example, in U.S. Pat. No. 4,110,685 a standing wave ratio measuring instrument includes two directional couplers which are inserted into the transmission line to produce output voltages indicative of the forward and reflected RF power. The measured voltages are processed to generate a signal proportional to the return loss in the system, which is related to the VSWR of the system. This signal is coupled to an analog display meter which is calibrated to provide a direct reading of the VSWR. Other similar VSWR measurement devices also measure the relative magnitude of the incident and reflected voltages to derive an indication of the VSWR of the transmission system. Examples of such systems can be found in U.S. Pat. Nos. 3,683,274 and 3,020,529.

In measurement instruments of the type found in these prior patents, the directional couplers used in the systems may be current transformers which are used to derive the forward and reflected voltages traveling in the transmission line. Such current transformers may cause these shifts of unknown magnitude, which are especially apparent at low frequencies. Such phase shifts introduce error into the resultant measured voltages and limits the accuracy of the VSWR measurement. Similarly, at high frequencies, a phase delay may be induced into the secondary winding of a transformer which again may limit the accuracy of the measurement therefrom. The frequency bandwidth may thereby be limited by the directional couplers used in these measurement systems which will limit their effective use. It has additionally been found that such measurement instruments are simply inserted at a point along a transmission line between the transmitter and antenna, and rely upon the transmitter as the source of RF power therefore. Relatively high RF power levels may be needed to obtain proper VSWR measurements, which present significant hazards to the user while tuning or adjusting an antenna of the system. There also exists the possibility that, if the VSWR is too high, the power reflected back to the transmitter could affectively destroy the output stage of the transmitter.

Other VSWR measurement instruments have been developed which avoid some of the problems associated with the measurement instruments as described above. In U.S. Pat. No. 4,580,092, a portable antenna match indicator for VSWR measurement is described which provides a direct readout of VSWR for the antenna. This instrument includes its own internally tunable low level RF signal source and is connected to the transmission system antenna for testing. Again, directional couplers are connected between the RF signal source and the antenna so as to sample the forward and reflected power on the transmission line coupling the two. Although the antenna match indicator as disclosed in this patent avoids reliance upon the RF transmitter as the source of RF power, significant disadvantages exist with respect to the frequency bandwidth over which the device can accurately measure VSWR.

There have also been developed in the prior art, a VSWR measuring device termed a "RX box" utilizing variable resistors and capacitors in the measuring circuit which are adjusted to null the received signals, thereby giving an indication of the VSWR for the system. A drawback of this type of device is found in that knowledge of various parameters of the antenna or other RF load were required along with the necessity for calculating the measured VSWR using these parameters along with the measurements obtained. Such a system does not provide an instantaneous indication of the VSWR, and is prone to error resulting from incorrect calculation or knowledge of the antenna parameters. Also, various measuring circuits designed to yield an indication of VSWR have included the use of bridge circuits to measure the reflection co-efficient of a transmission line network. The bridge circuit provides a reference against which an unknown impedance, being the impedance of the antenna or other RF load, is compared to give an indication of the VSWR. In prior art designs using a bridge circuit, an RF noise source has been provided by a noise diode and amplifier circuit to energize the bridge. Such bridge circuits have imposed a limit on the achievable accuracy of the measurement and/or have been frequency dependent and bandwidth limited due to the RF noise source only having useable harmonics up to about 50 MHz. Also, the use of a bridge circuit will normally require referencing one side of a response curve for the RF transmission system, wherein as the reference is approached the signal will be nulled. In this situation, it is possible that a detected VSWR would not be accurately indicated if on the other side of the response curve, unless the bridge circuit was perfectly balanced which is normally not the case.

SUMMARY OF THE INVENTION

Based upon the foregoing, there has been found a need to provide a VSWR indicator for an RF transmission system which includes an RF source, a transmission line and an RF load, wherein the VSWR will be very accurately and reliably indicated. It is therefore a main object of the invention to provide a VSWR indicator which will achieve very accurate and reliable VSWR measurements over a wide frequency bandwidth.

It is another object of the invention to provide a VSWR indicator which allows the user to instantaneously determine the VSWR of the RF transmission system without calculations or knowledge of the RF load or antenna parameters.

It is another object of the invention to provide a VSWR indicator which includes a self contained low level wideband signal source, such that use of the RF transmitter is avoided so as to prevent damage to the transmitter.

Another object of the invention is to provide a VSWR indicator which is portable and self-contained for use in field situations, and avoids the transmission of RF energy via the antenna during set up and tuning procedures which may cause interference or the unwanted transmission of RF energy.

It is a further object of the invention to provide a VSWR indicator which allows the user to distinctly determine the relationship between the measured VSWR and a reference point distinctly by providing an extremely flat signal response which maintains its integrity across the entire frequency bandwidth of interest.

Another object of the invention to provide a VSWR indicator which will indicate a variety of fault conditions accurately and effectively.

These and other objects of the invention are achieved by a pocket size antenna VSWR indicator having a self-contained low level wideband RF signal source which is applied to an antenna under test through a four arm RF resistive bridge circuit. The bridge circuit has been designed to be very accurate and reliable and provides a novelly positioned reference against which the reflection co-efficient of the transmission system is compared to reliably indicate the VSWR of the system. The RF null or bridge balance is detected in a radio receiver or transceiver tuned to the desired operating frequency, from which an indication of antenna VSWR may be provided. The antenna VSWR may be indicated in a variety of ways, such as by means of a numbered or colored dial, a plurality of LEDs or an audio tone shift against an internal reference. Alternatively, the indicator may be calibrated to read VSWR directly by number or by means of a color-dial indicating good, poor or non-usable VSWRs. The VSWR indicator provides the user with an immediate indication of whether the radio transmitter and antenna of the RF transmission system will be properly matched or coupled at the frequency in use, to assure maximum power transfer and efficiency. Additionally, the VSWR indication will immediately provide an indication of the overall system performance and will avoid the possibility of damaging or destroying the RF transmitter. The antenna impedance bridge of the invention allows the antenna to be tuned while keeping the radio carrier wave off the air so as to avoid interference therefrom or the unwanted detection of transmissions.

The VSWR indicator generally comprises an oscillator coupled to a frequency divider and buffer amplifier, which acts as a self-contained contained low level wideband RF signal source. This signal source is coupled to the antenna impedance bridge which is uniquely designed to achieve very accurate and reliable measurement of the reflection co-efficient of the RF transmission system. The bridge circuit includes a variable resistor which is used to fine trim the bridge for flat response over the desired wideband frequency range and over the range of antenna impedances which may be encountered. One leg of the bridge circuit comprises the antenna under test, such that its impedance may be referenced against a known bridge impedance. The indicator also includes a coupling circuit from the bridge to a tuned wideband detector such as a radio receiver. The VSWR indicator of the invention provides a portable, self-contained VSWR indicating device which is extremely simple to operate and which provides an immediate and direct read out of VSWR accurately.

BRIEF DESCRIPTION OF THE DRAWINGS

These and other objects and advantages of the invention will become apparent upon a further reading of the detailed description of the invention in conjunction with the drawings, wherein.

DETAILED DESCRIPTION OF THE INVENTION

Figure 1:
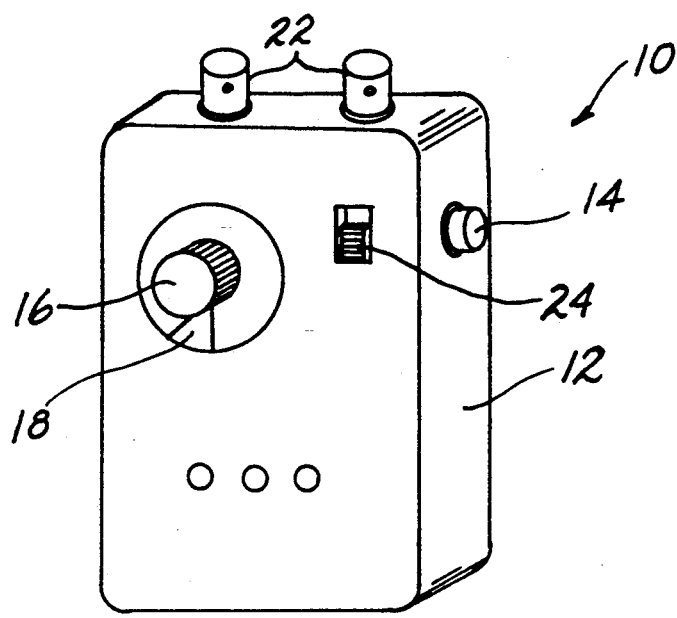
FIG. 1 is a perspective view of the portable, self-contained VSWR indicator according to the invention, and showing the various embodiments of indicating the measured VSWR which may be desired.

Referring to FIG. 1, there is shown the portable antenna VSWR indicator 10 which is a pocket size handheld indicating instrument. The indicator 10 may comprise a small housing 12, and is shown as having various means for indicating an antenna VSWR measurement or indication thereof. In a first embodiment, which will be described in more detail as the description proceeds, the VSWR indicator is adapted to provide a go/no-go VSWR indication relative to the impedance of an antenna in an RF transmission system which is to be matched to an RF transmitter. In this embodiment, the VSWR indicator produces an audio tone based upon an internal reference, wherein a push button 14 is depressed by an operator once indicator 10 is coupled to the antenna to be tested. An audio tone shift will indicate the measured VSWR relative to the reference. The dial 16 may be provided as a volume control so as to allow the user to adjust the volume of the audio tone so as to properly distinguish any tone shift arising during the testing procedure.

In alternate embodiments of the VSWR indicator of the invention, as will be described in more detail hereinafter, the VSWR measured by the device 10 may be indicated by means of a numbered or colored dial 16 which may be calibrated to read the VSWR indication directly. The numbered or a color-coded dial would indicate good, poor, or non-usable VSWRs when testing an antenna. In this embodiment the dial 16 may be provided with a window 18 through which a calibrated numbered or colored dial may be viewed by the user to give a direct indication of the measured VSWR. Alternatively, a pointer may be provided on dial 16 with the properly calibrated color-coded dial or numbers indicating the VSWR values positioned about the periphery of dial 16 In another embodiment, the detected VSWR of the antenna may be indicated by means of a plurality of LEDs 20 which will indicate a detected VSWR range. For example, a green colored LED may be provided to indicate a detected VSWR in an acceptable range, a yellow LED may be provided to indicate a VSWR which is not the optimum but which may be acceptable. Unacceptable VSWRs may be indicated by a red LED, or any of a variety of combinations could be utilized to indicate a go/no-go situation. In all of the above embodiments, the VSWR indicator 10 is coupled into the RF transmission system via BNC connectors 22, which allow easy coupling of device 10 with an antenna to be tested. Additionally, operation of the indicator may be initiated by an on/off switch 24. The VSWR indicator 10 provides a self-contained pocket size device which is easily used and which will effectively indicate the VSWR of an antenna, antenna matching network or other RF load whose impedance is to be matched to an RF transmitter or the like via a coaxial cable. The portability of the VSWR indicator 10 as well as the various means for indicating the detected VSWR of an RF load allow the device 10 to be used in field operations or at night while providing a clear and unambiguous indication of the detected VSWR.

Figure 2:
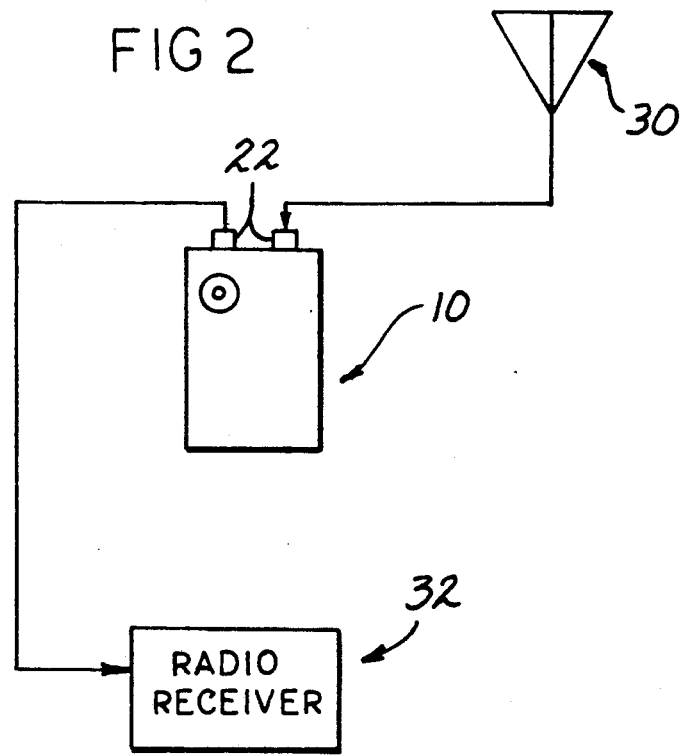
FIG. 2 is a block diagram of the VSWR indicator of the invention in use to measure the VSWR of an antenna which is to be matched to an RF transmitter at a desired operating frequency.

Turning to FIG. 2, there is shown the diagram of the VSWR indicator 10 as it would be coupled to yield an indication of the VSWR of an antenna 30 under test. The antenna 30 is coupled to the VSWR indicator 10 by means of the BNC connector 22 such that the antenna impedance may be determined against an internal reference impedance to indicate the VSWR thereof. The VSWR indicator 10 is also coupled to a radio receiver 32 as an example, wherein the radio receiver 32 will cause an audible signal to be heard upon the occurrence of an improper match between the antenna impedance and the internal reference impedance of the VSWR indicator 10. In this type of arrangement, the user may utilize headphones to better distinguish the occurrence of a null or an audio tone shift indicating the VSWR detected. In operation, the antenna 30 and radio receiver 32 are both initially coupled to the VSWR indicator 10, after which the VSWR meter 10 as well as the radio receiver 32 are both turned on. The radio receiver 32 is tuned to the desired operating frequency, and the VSWR indicator 10 is then adjusted until a null in the receiver is then achieved and the audio tone is eliminated wherein the VSWR may be read directly. Alternatively, the VSWR of the antenna 30 may be indicated by an audio tone shift against a known internal reference in the VSWR indicator 10. The VSWR of the antenna 30 will be detected as being matched with the internal reference of the VSWR indicator 10, thereby being matched to the RF transmitter at the desired operating frequency, or as indicating a mismatch between the antenna 30 and RF transmitter either above or below a reference impedance. Thus, the VSWR indicator 10 can be used to quickly and easily indicate the degree of match between the antenna and transmitter to be used to facilitate set up and tuning of the antenna.

Figure 3:
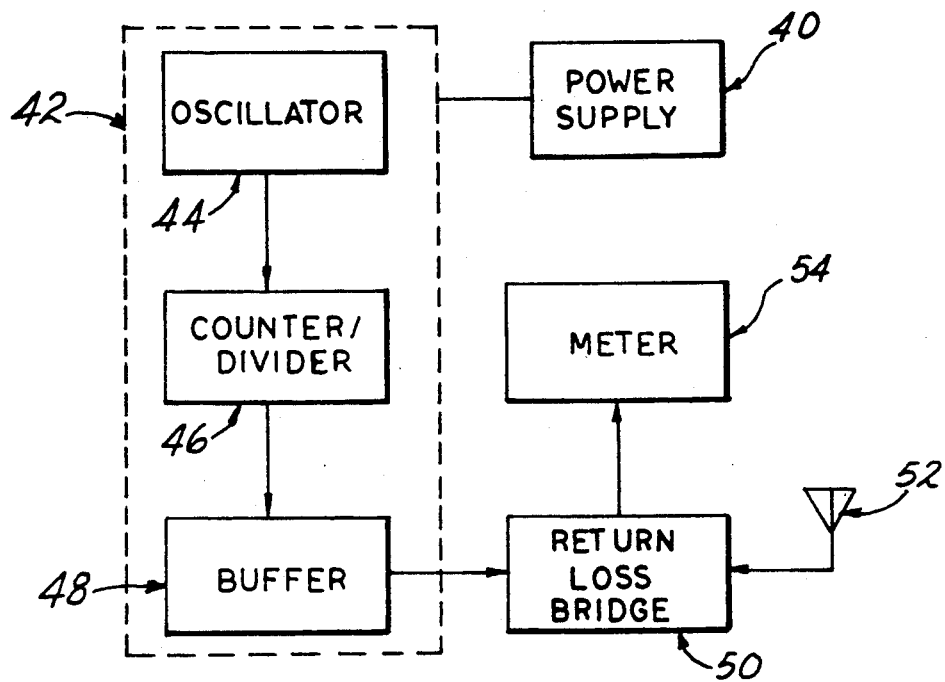
FIG. 3 is a block diagram of the basic circuit components of the VSWR indicator of the invention.

The basic circuit of the VSWR indicator is shown in block diagram in FIG. 3, wherein operating power for the circuit is provided by a power supply 40. Operating power is adopted to drive an RF noise generator indicated at 42. In the preferred embodiment, the RF noise generator 42 firstly comprises an oscillator 44, which may be a crystal oscillator adapted to set the main frequency of the noise generation circuit 42. The output of the crystal oscillator 44 is coupled to a counter/divider integrated circuit 46 which will effectively divide the main frequency to produce an audio tone. The oscillator, comprised of crystal oscillator 44 and divider 46 produces a square wave signal which is rich in harmonics usable over a wide frequency range so as to expand the bandwidth capabilities of the VSWR indicator. The square wave signal is coupled to a buffer circuit 48 which is used to isolate the oscillator from the remaining circuit components and also provides power to remaining components in the circuit. Particularly, the buffer 48 is used to isolate the oscillator from the bridge circuit, which may be termed a return loss bridge 50, and also provides power to drive the bridge circuit 50 in the VSWR indicator. The antenna 52 under test is coupled to the bridge circuit 50 such that the impedance thereof will be referenced against an internal reference provided by the return loss bridge 50. An indication of the VSWR detected for antenna 52 may then be output to a suitable audio or visual indicating device 54 to indicate the VSWR detected in any of a variety of ways.

Figure 4:
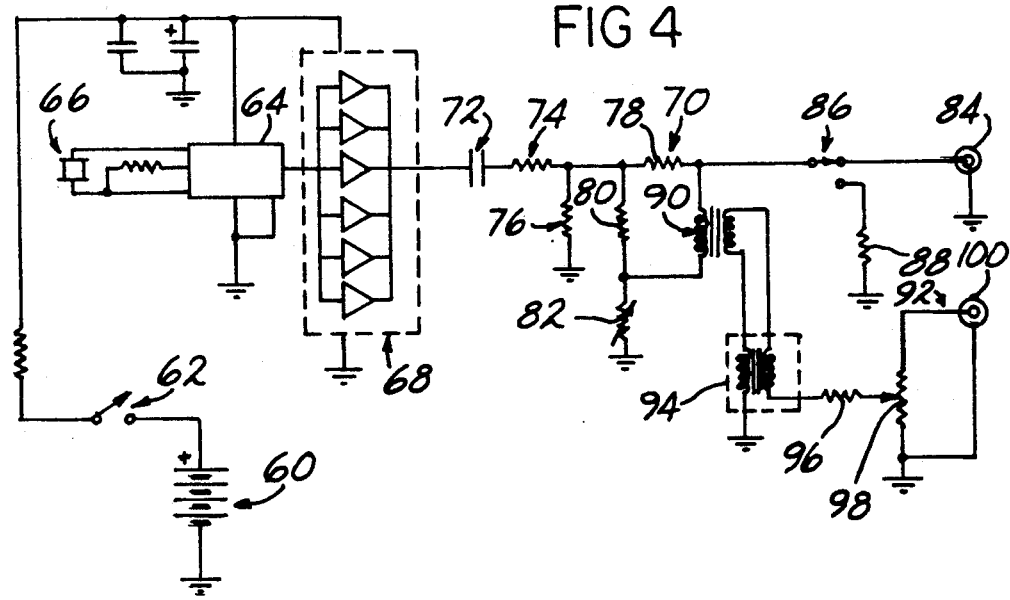
FIG. 4 is a schematic circuit diagram of a first embodiment of the invention.

A first embodiment of the VSWR indicator circuit is shown in FIG. 4 in more detail. As seen in FIG. 4, a battery supply 60 is provided, which may be a 9-volt battery or other suitable battery power supply. After coupling of an antenna to be tested to the VSWR indicator as previously described, an on/off switch 62 will selectively couple power to the circuit to enable testing of an antenna or other RF load as desired. A regulated voltage is supplied to an oscillator, divider integrated circuit 64, which has as an input a main frequency generated by crystal oscillator 66. As an example, the crystal oscillator operating at 32.78 KHz. sets the main frequency of the oscillator, which is then divided by 32 at divider 64 to produce a 1.024 KHz. audio tone. In such an arrangement, the crystal oscillator 66 in conjunction with the divider 64 produces a square wave signal which is rich in frequency harmonics usable to 150 MHz. Operating power from battery supply 60 is also supplied to hex buffer integrated circuit 68 which is used to isolate the oscillator from the bridge circuit and provides power to drive the bridge circuit. As an example, the divider 64 may be a CMOS counter/divider and the hex buffer 68 may be a CMOS hex Schmidt trigger. The output of the hex buffer 68 is coupled to the return loss bridge generally indicated at 70 by means of a coupling capacitor 72 which also serves as a DC isolator between the oscillator buffer 68 and the RF bridge circuit 70. A pair of resistors 74 and 76 form a voltage divider which provides a constant impedance load to accommodate the possibility that the antenna under test could vary from a short circuit to an open circuit.

The RF bridge circuit 70 consists of first and second resistors 78 and 80, which are a precision non-inductive matched pair, forming two arms of the RF bridge 70. A third resistor 82 forms a third arm of the RF bridge 70 and is a variable resistor or trim potentiometer used to fine trim the RF bridge 70 to achieve a flat response over a wide frequency bandwidth and with various antenna impedances. The output of the RF bridge 70 is coupled to the primary coil of a coupling transformer 90 which forms part of a coupling circuit to couple the output of bridge 70 to a radio receiver 92. The antenna under test is coupled into the bridge circuit 70 by means of BNC connector 84 and a switch 86 (corresponding to push button 14 of FIG. 1) which allows the antenna to be selectively coupled into the RF bridge circuit 70. The wideband RF signal source generated by the noise generation circuit will be applied to the antenna through the RF bridge circuit 70. The RF signal source as described may be tunable oscillator to provide a tunable signal source such that the antenna under test may be energized at the desired frequency for a particular application. Alternatively, switch 86 may be coupled to resistor 88 which serves as the reference impedance against which the antenna under test will be selectively referenced. The coupling transformer 90, forming part of the coupling circuit between the RF bridge 70 and an output circuit 92, provides isolation between the bridge output and output circuit 92. A balun 94 is interposed between the coupling transformer 90 and output circuit 92 for impedance matching and coupling therebetween. The output circuit 92 may be a radio receiver or transceiver which is used as a tuned wideband detector and may include resistor 96 and potentiometer 98 which form an output RF signal control to the receiver 92 so as to prevent receiver overload as well as volume control.

Figure 5:
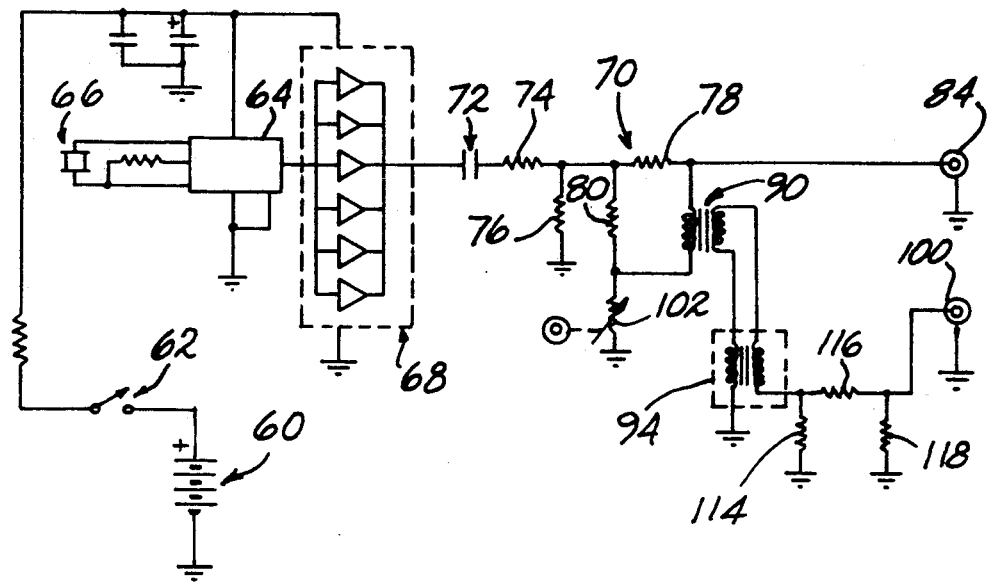
FIG. 5 is a schematic circuit diagram of a second embodiment of the invention.

Turning now to FIG. 5, an alternate embodiment of the VSWR indicator circuitry is shown, wherein like circuit components have been indicated with similar reference numerals as designated in FIG. 4. In FIG. 5, the crystal oscillator frequency divider and buffer again provide a self-contained wideband RF signal source which is rich in harmonics as previously described. In this embodiment, the antenna VSWR is indicated in an alternate fashion wherein the variable resistor 82 of the circuit described in FIG. 4 is replaced with a non-inductive panel mount potentiometer 102 wherein a detected VSWR can be directly indicated therewith. A panel mount potentiometer 102 may correspond to the dial 16 of FIG. 1, which may include a pointer over colored sections or numbers calibrated and positioned on the housing 12 of the VSWR indicator. Alternatively, the dial itself could be provided with calibrated numbering corresponding to the actual VSWR detected. As yet another example, the dial may be provided with a window 18 as seen in FIG. 1, which would reveal numbers or colored sections calibrated and positioned under the dial on the housing of the VSWR indicator. In operation, the user will listen for a null in the receiver coupled to BNC connector 100 by turning the panel mount potentiometer 102. Upon finding a null in the receiver, the number or color indicated by means of the dial will be the actual ratio or range of the detected VSWR of the antenna under test.

Figure 6:
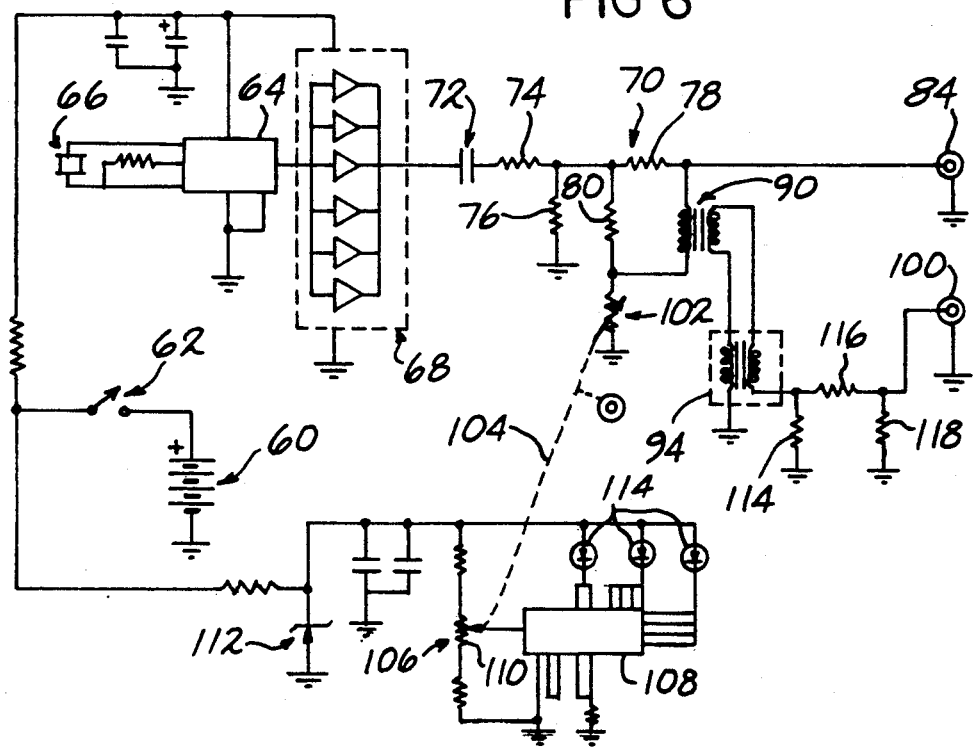
FIG. 6 is a schematic circuit diagram of a third embodiment of the invention.

Turning now to FIG. 6, another alternate embodiment of the VSWR indicator circuit is shown with similar elements indicated by similar reference numerals. Again, the RF noise source constituting the oscillator, divider and buffer as well as the RF bridge may be similar to that previously described, wherein the method of indicating the detected VSWR has been modified. In this embodiment, the variable resistor 82 of FIG. 5 again has been replaced with a panel mount non-inductive potentiometer 102 as described with reference to FIG. 6. As compared to FIG. 6, rather than providing the potentiometer 102 with a dial having calibrated numbers or a pointer relating to calibrated colored regions or numbers on the housing of the VSWR indicator, the potentiometer 102 is provided with a second section forming a part of a voltage divider 106 mechanically connected to the RF bridge 70 as indicated at 104. The voltage divider circuit 106 is adjusted in conjunction with the potentiometer 102 so as to track the VSWR indicated as the output of the RF bridge 70. A Dot/Bar display driver integrated circuit 108 will compare the voltage from resistor 110 corresponding to potentiometer 102 and the antenna VSWR when a null is detected in the receiver via BNC connector 100. Power for operation of the display driver integrated circuit 108 is coupled from battery power supply 60 as seen in FIG. 6, and a zener diode 12 acts to stabilize the reference voltage for accurate indications of the detected VSWR even as the battery supply 60 decays with use or time. The display driver integrated circuit 108 is adapted to drive a plurality of LEDs 114, which as an example may be a green, yellow and red LEDs indicating acceptable, marginal, or unacceptable VSWRs detected with the device. For example, the green LED may represent a VSWR in the range from 1:1 to 2:1, for impedances both above and below 1:1. Similarly, the yellow LED may represent a VSWR range from 2:1 to 3:1 and the red LED indicating a VSWR of 3:1 or greater, for impedances both above and below the reference impedance.

In both the embodiments of FIG. 5 and 6, the internal reference resistor 88 utilized in the embodiment of FIG. 4 has been eliminated along the push button switch 86 associated therewith. In these embodiments, the antenna impedance will always form one arm of the RF bridge 70, wherein the actual impedance of the antenna will be measured as related to the RF bridge 70. Upon the occurrence of an unbalanced bridge condition in the RF bridge 70, an RF voltage will be generated across the coupling transformer 90 thereby giving an indication of the actual VSWR detected. Additionally, in these two embodiments, the potentiometer 98 associated with the receiver 92 in the embodiment of FIG. 4 has been eliminated and replaced with a fixed attenuator pad comprising resistors 114, 116 and 118, which will provide isolation of the receiver from the RF bridge 70 in conjunction with balun 94 and also attenuation which is desired due to the possibility of overloading the receiver. The embodiments as described with reference to FIGS. 4-6 each provide true and accurate VSWR indications for an antenna under test, but it should be apparent that the VSWR indicator could be applied to other antenna applications or cable testing applications while achieving the same benefits. It should also be apparent that various modifications may be made in the circuits as described without departing from the general concepts thereof, such as moving the volume control potentiometer from the receiver output to control the output of the noise generator in the embodiment of FIG. 4 as an example. Additionally, the methods of indicating the antenna VSWR either by an audio tone shift, numbered or colored dial or LEDs are only preferred embodiments, and a variety of other indicating techniques could be utilized.

As a preferred example of the operation of the RF bridge circuit 70 as described above, an antenna under test which is resonant at a given operating frequency will exhibit an impedance of near 50 ohms. This impedance would allow no reflected power and yield a VSWR of 1:1 or an optimum tuned condition. Under these circumstances, the RF bridge 70 will be balanced and the RF voltage across the primary coil of transformer 90 will be zero, thereby causing no audible signal to be heard in a receiver coupled to output circuit 92. Alternatively, for antenna impedances of other than 50 ohms, other values of VSWR such as 2:1; 3:1; 4:1; or open or short conditions will result in an unbalanced bridge and cause an RF voltage to appear across coupling transformer 90. This bridge output signal is coupled through transformer 90 and impedance matching balun 94 to the output or volume level control 98 and to the BNC connector 100 of output circuit 92. A receiver coupled to connector 100 will allow the user to receive an audible tone indicating the value of VSWR detected. As an example, it has been found that the reference resistor 88 of FIG. 4, to which the antenna impedance is compared, may be chosen to represent a VSWR value of 2.4:1, which has been found to provide a distinctive tone shirft, between 2:1 and 3:1 ratios, allowing very accurate and reliable VSWRs to be detected for the antenna under test. This reference allows the user to determine the relationship of the detected VSWR to the reference distinctly without calculations or knowledge of antenna parameters and without the possibility that inaccurate VSWRs will be indicated from a shifting of the actual antenna signal relative to the internal reference. It should be apparent that other VSWR reference values may be used for various application, although a reference VSWR of 3:1 or higher may damage the transmitter. As previously mentioned, the variable resistor or trim pot 82 is used to fine trim the RF bridge 70 to provide a flat response over a broad frequency bandwidth. For example, the variable resistor 82 is trimmed to match the precision impedance for the antenna to generate a flat response over a frequency range of 2-150 MHz. and over other antenna impedances of 1-2-3-4:1, open and short conditions. Flatness is adjusted for a perfect match for a 2:1 VSWR as an example, with both high and low 2:1 impedances being accurately indicated.

Figure 7:
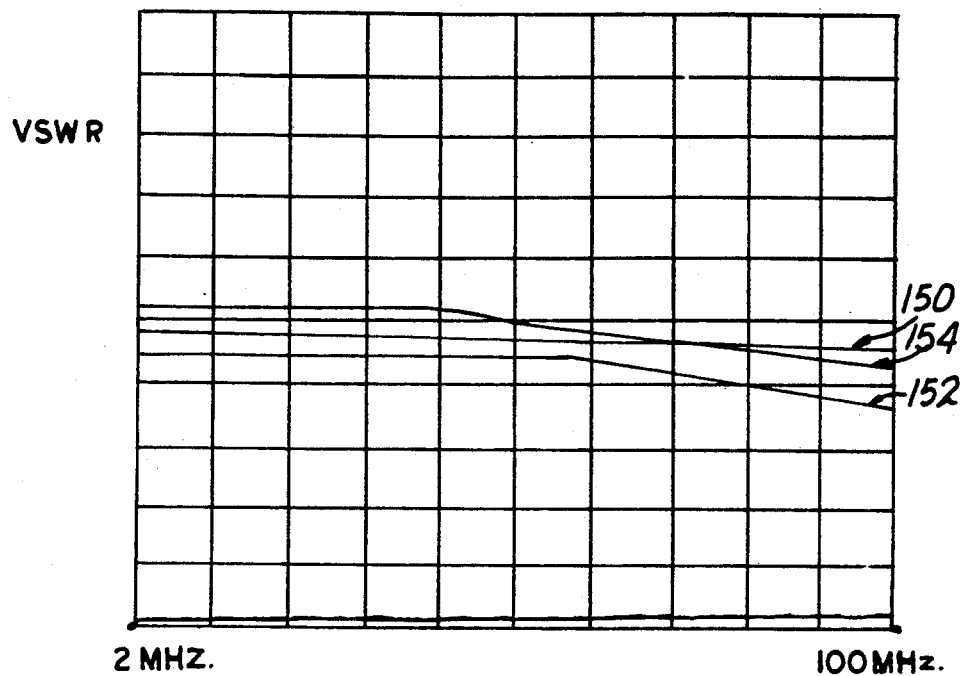
FIG. 7 is a graphical illustration showing the effect of a non-flat frequency response of a ,bridge circuit conventionally used in the prior art which could allow an untrue or inaccurate VSWR and give a false indication of antenna condition.
Figure 8:
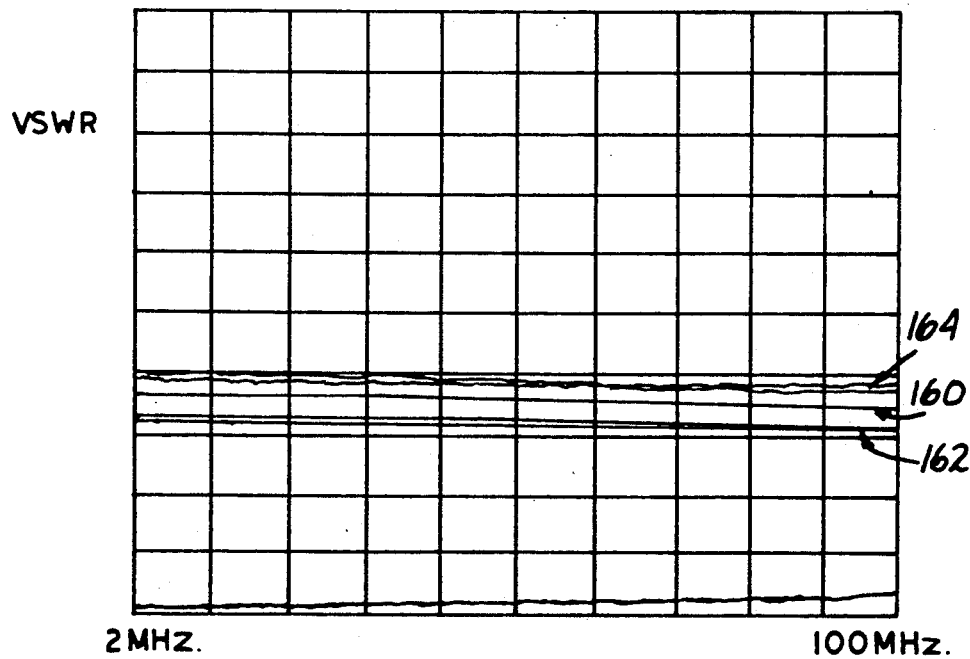
FIG. 8 is a graphical illustration showing the frequency response of the VSWR indicator of the invention showing the flatness of the response yielding true and accurate indications of antenna condition.

Referring to FIGS. 7 and 8, there is shown graphical representations of output responses, both for an RF bridge representative of the prior art and the RF bridge of the present invention. In the example shown in FIGS. 7 and 8, a frequency range from 2.0 MHz to 100.0 MHz is shown relative to the measured VSWR of various impedance antennas under test. In FIG. 7, there is shown the effect of a non-flat output response from a bridge circuit which is especially apparent at the higher end of the frequency range shown. In FIG. 7, a reference VSWR of 2.4:1 is indicated by trace 150, which is constant over the frequency range. A 2:1 VSWR antenna output response from the bridge circuit is shown by trace 152, which although not providing a flat response over the entire frequency bandwidth, does remain in proper relationship relative to reference VSWR of trace 150. A 3:1 VSWR antenna output response from a bridge circuit is shown by trace 154, which as seen in FIG. 7 is non-flat over the frequency bandwidth. Due to the non-flatness of the VSWR output response over the frequency bandwidth, the 3:1 VSWR trace 154 is seen to cross the reference 2.4:1 VSWR of trace 150, thereby giving a false indication of antenna condition as the 2.4 VSWR reference seemingly lies above a 3:1 VSWR which clearly cannot be the case. In this situation, inaccurate VSWRs will be indicated, and the signal between the actual antenna and the internal reference may be shifted such that VSWR values above and below the VSWR reference may not be accurately and truly indicated. Turning to FIG. 8, the RF bridge circuit of the present invention allows an extremely flat output response to be achieved so as to avoid possible false indications of antenna condition as described with reference to FIG. 7. Again, the graphical illustration of FIG. 8 shows the VSWR output response over a frequency range of 2.0 MHz. to 100.0 MHz. as a selected frequency bandwidth. The reference VSWR of 2.4:1 is indicated by trace 160 similar to that of FIG. 7. A 2:1

VSWR antenna output response is shown for antenna impedance values both above and below the VSWR reference as indicated by the dual traces at 162. The dual traces 162 may represent for example, antenna impedances of 25 ohms and 100 ohms being above and below a 1:1 VSWR corresponding to an impedance of 50 ohms. Similarly, a 3:1 VSWR antenna output response is shown by dual traces 164 which may represent antenna impedances of 150 ohms and 16 ohms, being both above and below the reference VSWR. For both 2:1 and 3:1 VSWRs, the dual traces 162 and 164 show the proper VSWR flatness over the working frequency range to ensure that true and accurate VSWRs are indicated and false antenna conditions are avoided. The relationship between the 2:1, 3:1 and reference impedances as indicated in FIG. 8 allow a good audible tone shift to be heard in the embodiment of FIG. 4 for VSWR indications above and below the reference VSWR to facilitate set up and tuning procedures for the antenna under test.

In the embodiment of the invention as described in FIG. 4, should be understood that the value of the reference resistor 88 may represent any VSWR and the flatness may be adjusted for a perfect match for any VSWR as desired, although in the preferred embodiment, the 2:4 VSWR reference has been found to provide excellent results. The flatness requirement of the response over the broad frequency range is very important to avoid the indication of inaccurate VSWRs which may be created from a shift of the signal between the actual antenna and the internal reference. Thus, any detected VSWR will be truly and accurately identified either above or below the reference VSWR across the entire bandwidth of interest. It should also be understood that although the reference resistor 88 defines a fixed VSWR, it may be possible to provide a variable resistor as a reference wherein when a null is found, a calibrated potentiometer may be used to measure the resistance at the null to determine the VSWR detected. It should also be understood that the RF bridge circuit as described is applicable to a wide variety of frequency ranges and will provide the desired flat response over an extremely wide bandwidth as compared to the prior art.

Figure 9:
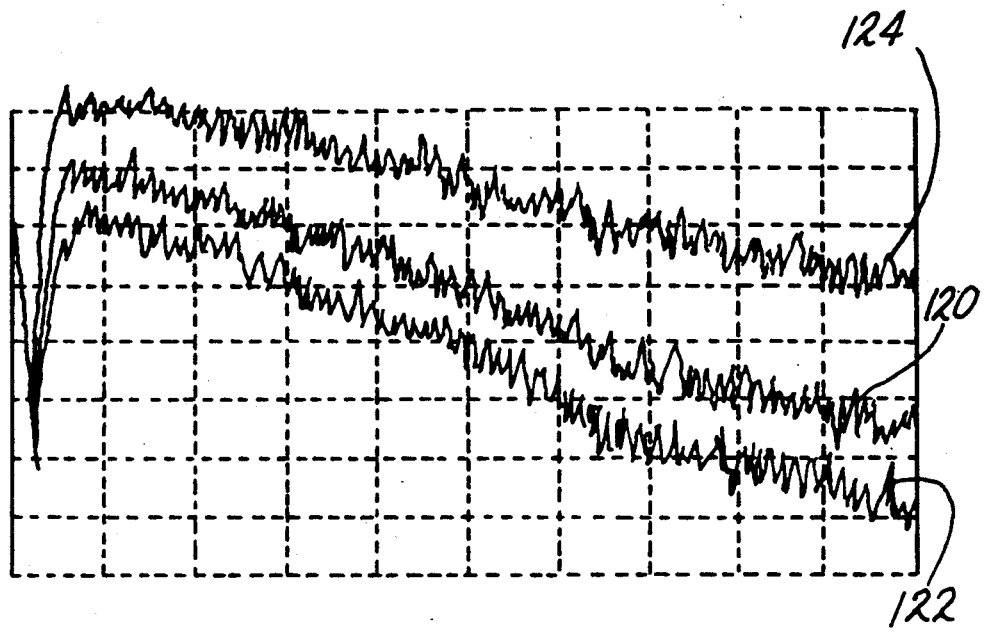
FIG. 9 is a graphical illustration of the VSWR bridge noise output over a preselected frequency range for the invention.
Figure 10:
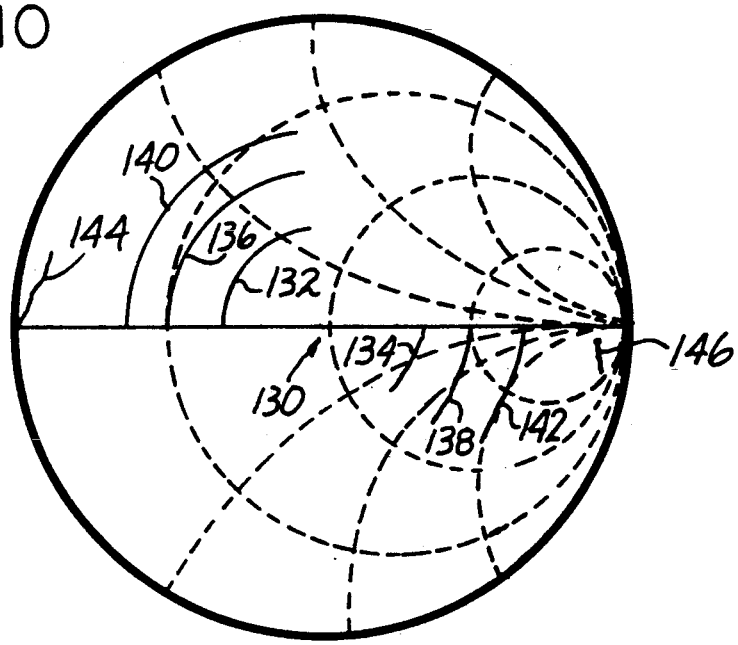
FIG. 10 is a Smith chart showing the VSWR indication for antenna impedances both above and below the reference impedance of the VSWR bridge of the invention as well as open and short fault conditions for the system.

Turning now to FIG. 9, there is shown a VSWR bridge noise output over frequency range from 2 to 100 MHz as shown on a spectrum analyzer. The wideband RF noise source of the invention provides a wider range of usable harmonics acting to extend the frequency bandwidth over which the VSWR indicator will truly and accurately detect antenna VSWRs. In FIG. 9, the output response of the VSWR bridge noise generator is shown with the internal reference resistor 88 of FIG. 4 in the circuit which generates trace 120 indicating a VSWR of 2.4, in a preferred embodiment as previously described. Additional traces on FIG. 9 include an antenna having a 2:1 VSWR at 122 and a 3:1 VSWR antenna generating trace 124. The output response of the VSWR bridge circuit for each of these values is clearly distinct and properly positioned relative to the reference VSWR as indicated by trace 120. The RF bridge is therefore seen to be very accurate and reliable with any detected VSWR being properly positioned about an internal reference within the device so as to allow the user to properly determine the VSWR measured in relation to that reference. These results achieved by the RF bridge circuit are consistent across the entire bandwidth of interest which is the ultimate criticality of proper VSWR indication as desired. This advantage is also seen in FIG. 10, which shows a Smith chart for measured impedances both above and below the reference impedance for a frequency range from 2.0 MHz. to 100 MHz. A VSWR of 1:1, which may correspond to an impedance of 50 ohms, is identified at point 130 of the chart. Antenna impedances both above and below the optimum are clearly indicated and represent constant VSWR indications corresponding to other VSWR values. For example, with the reference impedance of 50 ohms indicating a 1:1 VSWR, the 2:1 VSWR is shown both above and below the reference at traces 132 and 134 which represent impedance values of 25 ohms and 100 ohms respectively. A 3:1 VSWR both above and below the reference is indicated by traces 136 and 138 representing impedance values of 16.6 ohms and 150 ohms respectively. Similarly, a 4:1 VSWR representing impedance values of 12.5 ohms and 200 ohms are represented by traces 140 and 142 respectively, while short or open antenna conditions are represented by traces 144 and 146 respectively. It should be apparent that the RF bridge of the invention provides true and accurate indications of VSWR both above and below the reference without the possibility of the occurrence of the shifting of the signal between the actual antenna VSWR and the internal reference of the RF bridge.

In contrast to the prior art, the VSWR indicator of the invention provides true and accurate VSWR indications over an extremely wideband frequency range as desired. The VSWR indicator of the invention provides a self-contained low level wideband RF signal source, which obviates the need to use an RF transmitter as the signal source. This avoids possibly damaging the RF transmitter as well as undesirable transmission of RF energy during tuning procedures of the antenna. The circuit of the present invention allows the user to distinctly determine the relationship between the measured VSWR and a uniquely defined internal reference by providing an extremely flat signal response which maintains its integrity across the entire frequency bandwidth of interest. A variety of fault conditions may be accurately and effectively indicated, and a variety of indicating methods facilitate use of the VSWR indicator for a variety of field situations which may be encountered.

Although the present invention has been described in terms of various preferred embodiments thereof, it should be understood that the foregoing description is illustrative only and that many modifications may be made without departing from the spirit and scope of the invention as defined in the appended claims.

What is claimed is:

1. An apparatus for measuring a voltage standing wave ratio (VSWR) of a signal on a transmission line between a radio frequency signal source and a radio frequency load which comprises;

a RF noise source generating a predetermined RF signal over a desired frequency range which is applied to said RF load under test;

a RF bridge circuit coupled to said RF noise source and adapted to produce a flat output response over said frequency range, wherein said RF bridge circuit comprises a four arm resistive bridge circuit with one arm thereof comprising an impedance which is selectively coupled into said RF bridge circuit by switch means, said impedance selectively comprising the impedance of said RF load or a reference impedance; and coupling circuit means connected to said RF bridge circuit for coupling the output thereof to a detector circuit means which will give an indication of the VSWR measured for said RF load under test.

2. The apparatus of claim 1, wherein, said RF noise source comprises an oscillator circuit including a crystal oscillator resonant at a preselected frequency, which is adapted to set the main frequency of said oscillator circuit, with said crystal oscillator coupled to a frequency divider to produce a RF signal having a preselected frequency content, and a buffer circuit adapted to isolate said oscillator circuit from said RF bridge circuit and to provide power to drive said RF bridge circuit.

3. The apparatus of claim 2, wherein, said oscillator circuit produces a wideband square wave RF signal which includes frequency harmonics usable to 150 MHz.

4. The apparatus of claim 1, wherein, said RF noise source generates a wideband RF signal used to energize said RF bridge circuit, wherein said wideband RF signal is a square wave signal having multiple frequency harmonics so as to extend the frequency response of said output from said RF bridge circuit.

5. The apparatus of claim 1, wherein, said RF bridge circuit comprises first and second resistors constituting an internal portion of said RF bridge circuit and being a precision non-inductive matched pair, with a third resistor being a variable resistor used to fine trim the RF bridge circuit to correspond to the impedance which is selectively coupled into said bridge circuit so as to generate a flat response over said frequency range.

6. The apparatus of claim 1, wherein, said impedance of said RF load under test will be compared to the value of the reference impedance to give an indication of the VSWR of said RF load.

7. The apparatus of claim 1, wherein, said reference impedance which may be selectively coupled into said RF bridge circuit represents a preselected VSWR to provide a reference VSWR against which the impedance of said RF load is compared to give a relative indication of the VSWR of said RF load under test.

8. The apparatus of claim 7, wherein, said reference VSWR is selected to be in the range from 2.3 to 2.6:1, and wherein VSWR values of said RF load under test which fall both above and below said reference VSWR will be accurately indicated.

9. The apparatus of claim 1, wherein, said RF noise source generates an RF signal of a preselected frequency which will produce an audio signal, and said detector means is a radio receiver used as a tuned wideband detector which will generate an audible signal indicative of the VSWR of the RF load under test.

10. The apparatus of claim 9, wherein, said radio receiver includes an output RF signal control to prevent receiver overload and to provide volume control for the audible tone produced thereby.

11. The apparatus of claim 1, wherein, said coupling circuit includes a coupling transformer having a primary winding thereof coupled to said RF bridge circuit, wherein an unbalanced condition of said RF bridge circuit will produce an output RF voltage across said coupling transformer, and said coupling transformer provides isolation between said RF bridge circuit and said detector means.

12. The apparatus of claim 11, wherein, said coupling circuit further includes an impedance matching balun for impedance matching and coupling between said coupling transformer and said detector means.

13. The apparatus of claim 1, wherein, said detector means comprises a radio receiver producing an audible tone wherein the output of said RF bridge circuit will be coupled to said radio receiver to produce an audible tone indicative of the VSWR of said RF load under test.

14. The apparatus of claim 1, wherein, said detector means comprises a radio receiver which produces, an audible tone upon the coupling of an output signal from said RF bridge circuit, and a trim potentiometer forming one arm of said bridge circuit is adapted to balance said bridge circuit such that no output will be coupled to said radio receiver from said bridge circuit indicating a null in said radio receiver and being indicative of the VSWR detected for said RF load under test, wherein said trim potentiometer includes means by which said detected VSWR may be directly read therefrom.

15. The apparatus of claim 14, wherein, said means by which the detected VSWR is directly read comprises a calibrated numbered dial, the position of which directly indicates the detected VSWR.

16. The apparatus of claim 14, wherein, said means by which the detected VSWR may be directly read comprises a calibrated dial having colored regions thereon, wherein the position of said dial indicates good, poor, and nonusable detected VSWRs.

17. The apparatus of claim 14, wherein, said means by which a detected VSWR may be directly read comprises a plurality of LEDs, each of which corresponds to an actual VSWR range, wherein the detected VSWR of the RF load under test will turn on the appropriate LED to give an indication of the detected VSWR directly.

* * * * *